United States Patent [19]
Mansfield et al.

[11] Patent Number: 5,325,060
[45] Date of Patent: Jun. 28, 1994

[54] COIL CIRCUITS

[75] Inventors: Peter Mansfield; Ronald J. Coxon, both of Nottingham, England

[73] Assignee: British Technology Group Limited, London, England

[21] Appl. No.: 949,514

[22] PCT Filed: May 24, 1991

[86] PCT No.: PCT/GB91/00826
§ 371 Date: Nov. 17, 1992
§ 102(e) Date: Nov. 17, 1992

[87] PCT Pub. No.: WO91/19207
PCT Pub. Date: Dec. 12, 1991

[30] Foreign Application Priority Data

May 25, 1990 [GB] United Kingdom ............... 9011757

[51] Int. Cl.$^5$ .............................................. G01V 3/00
[52] U.S. Cl. .................................................. 324/322
[58] Field of Search ............... 324/300, 307, 309, 310, 324/311, 312, 313, 314, 318, 322; 128/653.2

[56] References Cited

U.S. PATENT DOCUMENTS

| | | | |
|---|---|---|---|
| 4,680,545 | 7/1987 | Gray et al. | 324/307 |
| 4,742,304 | 5/1988 | Schmall et al. | 324/318 |
| 4,862,084 | 8/1989 | Mitomi | 324/309 |
| 5,162,736 | 11/1992 | Mansfield et al. | 324/309 |
| 5,168,228 | 12/1992 | Mansfield et al. | 324/309 |

FOREIGN PATENT DOCUMENTS 2184625 12/1986 United Kingdom .

OTHER PUBLICATIONS

J. M. S. Hutchinson, et al., "NMR Imaging: Image Recovery Under Magnetic Fields with Large Non-Uniformities" Journal of Physics E: Scientific Instruments, vol. 11, 1978, the Institute of Physics (Bristol, GB) no month pp. 217–221.

A. Macovski, et al. "Gradient Power and $T_2$ Considerations in Rapid Imaging", Society of Magnetic Resonance in Medicine, Sixth Annual Meeting and Exhibition, Aug. 17–21, 1987 p. 449.

M. O. Leach, et al. "The Design and Use of a Dual-Frequency Surface Coil Providing Proton$_{31}$ Images For Improved Localization in P Spectroscopy of Small Lesions", Medical Physics, vol. 13, No. 4, Jul./Aug. 1986, (New York, US) pp. 510–513.

J. Troop, et al. "A Dual-Tuned Probe and Multiband Reveiver Front End for X-Nucleus Spectroscopy with Proton Scout Imaging in Vivo", Magnetic Resonance in Medicine, vol. 11, No. 3, Sep. 1989, (Duluth, Minn., US) pp. 405–412.

P. Mansfield, "Multi-Planar Image Formation Using NMR Spin Echoes", J. Phys. C: Solid State Physics vol. 10, 1977 p. L55 (no month).

P. Mansfield, et al. "Volumar Imaging Using NMR Spin Echoes: Echo-Volumar Imaging (EVI) at 0.1 T", J. Phys. E. Sci. Instrum. 22 (1989) pp. 324–330 (no month).

Primary Examiner—Michael J. Tokar
Attorney, Agent, or Firm—Cushman, Darby & Cushman

[57] ABSTRACT

A coil circuit comprising a multi-mode resonant gradient or RF coil circuits for imaging and spectroscopy in Nuclear Magnetic Resonance systems.

13 Claims, 10 Drawing Sheets

Voltage generator
or current generator

COIL CIRCUITS

The present invention relates to coil circuits and more particularly to multi-mode resonant gradient coil circuits for imaging and spectroscopy in Nuclear Magnetic Resonance (NMR) systems.

Ultra high speed imaging techniques like echo-planar imaging, P. Mansfield, J. Phys. C. 10, L55 (1977) and echo-volumar imaging, P. Mansfield, A. M. Howseman and R. J. Ordidge, J. Phys. E. 22, 324–330 (1989) require at least one gradient which is either sinusoidally or cosinusoidally modulated, or preferably trapezoidally modulated. Sinusoidal or cosinusoidal modulation is straight forward to achieve in practice by using a series or parallel resonant circuit in which the gradient coil assembly forms the inductance. Data acquisition in such an imaging arrangement can be achieved by varying the data sampling rate in order to get equal spin phase increments between sampling points. A disadvantage of this method is the fact that the peak gradient amplitude is $\pi/2$ greater than the amplitude of an equivalent square wave modulation. This means that the gradient driver amplifier must be capable of supplying $\pi/2$ more current than in the square or trapezoidal modulation case.

Another factor which militates against using sinusoidal modulation is patient safety. Induced currents within the body due to rapidly varying magnetic field gradients present a potential hazard if the induced current levels approach the neural stimulation threshold level. Neurone models suggest that the important factors determining neural stimulation are concerned with the charging and discharging of nodal capacitance in the process of achieving the neurone firing potential. This leads to a formula which involves the product of the rate of change of magnetic field within the body multiplied by the duration over which this time variation applies. When this function is suitably integrated, (it has been shown that P. Mansfield [to be published]) that the critical factor in calculating stimulation threshold levels for gradient switching is not the rate of change of magnetic field but the maximum field excursion experienced by the tissue. Indeed, neurone stimulation turns out to be independent of the rate of change of the gradient field. In this circumstance it is, therefore, more efficient, and in general, safer, to consider fast rise trapezoidal or square wave modulation of currents rather than sinusoidal gradients since for a given imaging time square wave gradients are $2/\pi$ lower that those with an equivalent sinusoidal modulation.

The practical problem is how to generate a fast rise square wave for use in a whole body imaging machine. It is clear that for the most efficient square wave modulation system, the circuit arrangement must be energy conserving. Such energy conserving non-linear switches have been developed and described (British Patent GB 2184625B). A difficulty with non-linear circuitry is that the switch is an active device and will have a maximum current carrying capacity and at the same time be required to have a high inverse voltage requirement. High power switches capable of carrying 500 to 1000 amps are not available with the requisite peak inverse voltage requirements of up to 10 kV. Such devices may be developed in the future but are likely to be very expensive and temperamental.

The present invention provides an entirely passive circuit approach to the generation of trapezoidal and square wave modulated gradients for use in high speed NMR imaging. The circuit arrangement according to the present invention operates in a series drive arrangement which is eminently suitable for high current, low voltage audio amplifiers currently available commercially. A parallel multi-modal circuit has been described A. Macovski and C. Meyer, Proceedings of the 6th Annual Meeting, Society of Magnetic Resonance in Medicine, New York, 1, 499 (1987) but is not as valuable because high voltage driver amplifiers are required.

The present invention provides a multi-mode resonant coil circuit comprising passive components for generation of a square, trapezoidal or general output current waveform in an inductive coil which forms a magnetic field gradient coil when supplied from a voltage or current generator with a series of suitably weighted Fourier Harmonics forming the input waveform, characterised in that the arrangement of the passive components is such that the total current from the voltage or current generator passes through said gradient coil.

Preferably the passive components comprise a plurality of capacitors, resistors and inductors the arrangement of which is placed in series with a coil, the plurality of capacitors, resistors and inductors being connected in at least two parallel circuits, each parallel circuit comprising at least one parallel capacitor/inductor combination.

The present invention also provides a method of generating a square wave, trapezoidal or other waveform for an NMR apparatus including connecting a passive electrical circuit in series with one terminal of a coil, connecting a current or voltage waveform source across the coil and the passive electrical circuit and energising said waveform current or voltage source, the method being characterised in that the coil is a gradient coil in that all of the current from said voltage or current waveform source passes through said gradient coil and in that the current or voltage waveform comprises a series of suitably weighted Fourier Harmonics.

The present invention makes possible a method of designing a multi-mode resonant gradient coil circuit for generating a square wave, trapezoidal or other output current waveform through an inductor from a suitable input current waveform using only passive components.

Embodiments of the present invention will now be described, by way of example with reference to the accompanying drawings, in which:

FIGS. 10 (a), 10(b) and 10 (c) show a comparison of the waveform convergence at T/4 for (a) a square wave, and trapezoidal waveforms with (b) p=3 and (c) p=9;

Figure 1A:
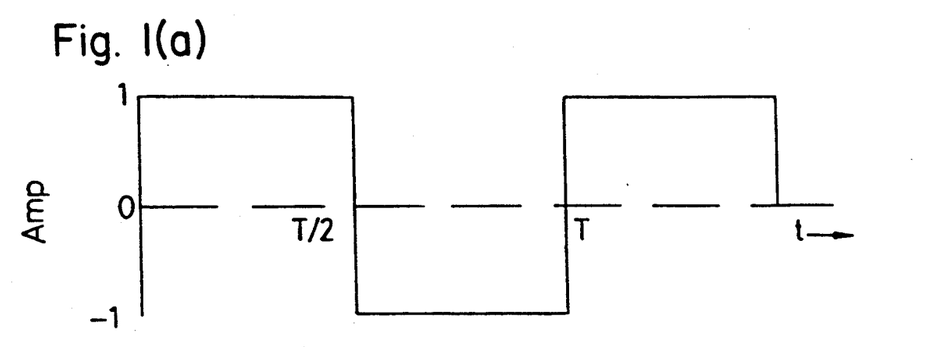
FIG. 1a shows a sketch of a bipolar square waveform with period T and unit amplitude.
Figure 1B:
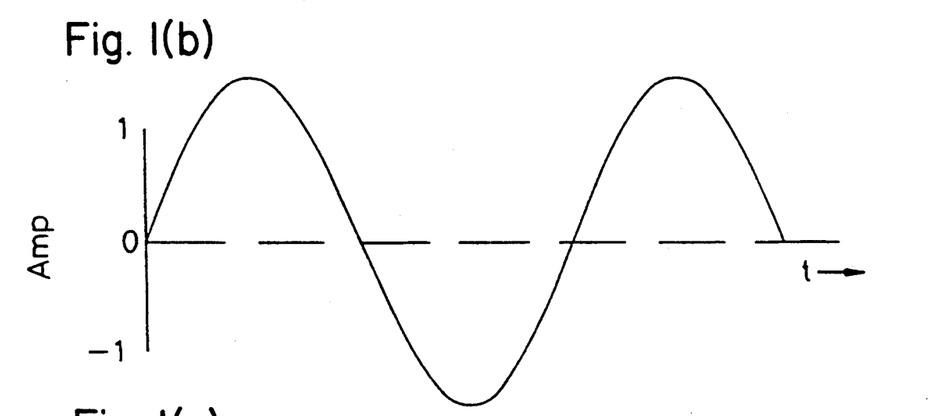
FIG. 1b shows the simpler sine wave approximation to FIG. 1a in which the areas under the sinusoidal and square wave curves in a half period are equal.
Figure 1C:
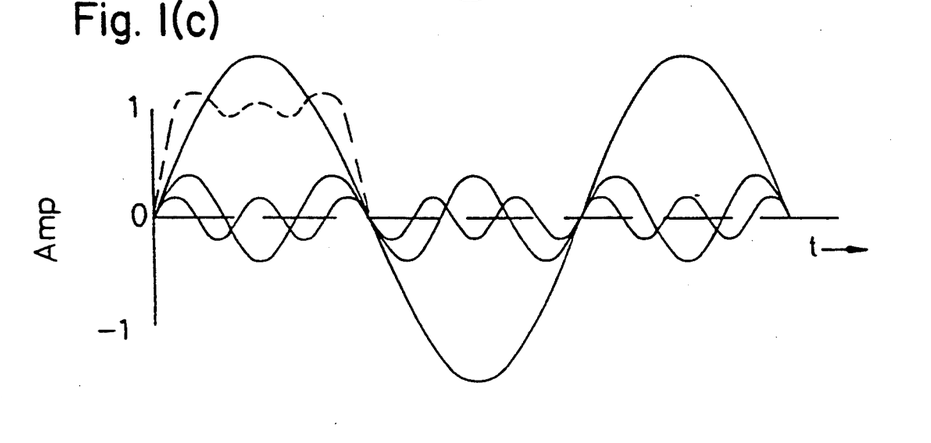
FIG. 1c shows partial synthesis of the square waveform of FIG. 1 from the first three Fourier harmonics.

The repeated bipolar square wave of unit amplitude shown in FIG. 1a may be represented by the Fourier series.

$$f(t) = (4/\pi)\{\sin \omega t + (\tfrac{1}{3})\sin 3\omega t + (1/5)\sin 5\omega t\} \quad (1)$$

where f(t) is the square wave function with period T=2$\pi$/$\omega$. Equation 1 represents an odd harmonic expansion in which $\omega$ is the fundamental frequency, 3$\omega$ and 5$\omega$ the third and fifth harmonics etc. in a slowly converging series. FIG. 1c shows an ideal square wave and its synthesis from a truncated series of harmonics. Although the series is slowly converging, we see that using the first and third harmonics give a recognisable approximation to a continuous square wave. Adding the fifth harmonic gives an even better approximation but more importantly brings the maximum waveform excursion down from $\pi$/2 in the case of the first harmonic to 1.2. Adding further harmonics like the seventh and ninth may not be worthwhile experimentally because of slow convergence. Also their contribution will not significantly affect the safety questions referred to hereinbefore.

The present invention is therefore to construct a multi-resonant circuit capable of responding to a specified finite number of harmonics as indicated above.

Figure 2:
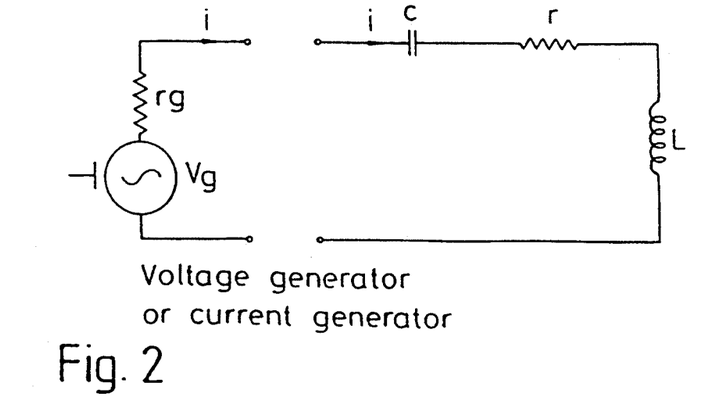
FIG. 2 shows a prior art simple series resonant circuit and generator drive.

We now describe a general and systematic approach to the generation of circuits which are effectively discrete frequency filters. FIG. 2 shows a prior art simple series resonant circuit in which L represents the inductance of the current coil assembly. Also shown in this circuit is the amplifier drive arrangement here represented as a voltage generator but may alternatively be a current generator. In such a series arrangement it is clear that the total generator current i passes through L and thus represents the most efficient arrangement for producing high magnetic field gradients. The present high current commercial audio amplifiers are capable of delivering their full current capacity into what is effectively a short circuit, ie. a series resonant circuit. These amplifiers can be operated either as voltage generators or alternatively as current generators. In the current generator mode, it is possible to control more accurately the response time when driving a series tuned circuit. In general the rise time for a series tuned circuit as in FIG. 2 is determined by the quality factor Q given by $$Q = \omega L/r \quad (2)$$

The current for this circuit will rise to $(1-e^{-1})$ of its final current in Q/$\pi$ cycles when driven in the voltage mode. In current mode the rise time can be significantly shorter so that the equilibrium situation can often be achieved in just one cycle.

In order to accommodate the necessary higher harmonics to form an approximate square wave, additional components are introduced to the simple series tuned circuit of FIG. 2, but in such a way that all the harmonic current components pass through L.

Figure 3:
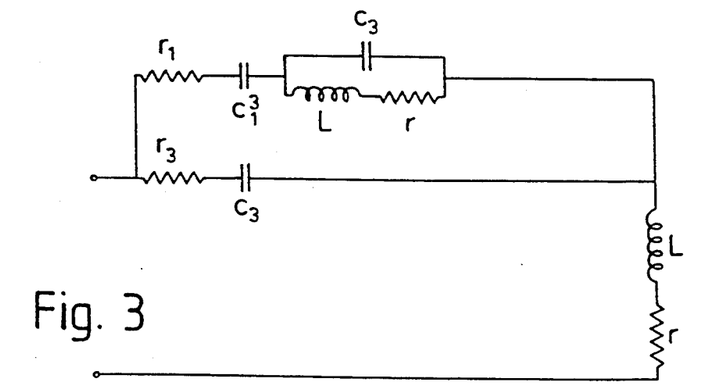
FIG. 3 shows a bimodal series resonant circuit of order l=3.

FIG. 3 shows a modified circuit which accommodates the fundamental and third harmonic only. In calculating the requisite component values of this circuit, we take all resistors to be effectively zero in the first instance. It is also helpful but not absolutely necessary to make all inductors equal to L. The design process then reduces to calculating the component values starting with the highest harmonic, in this case the third harmonic, at which $C_3$ and L are resonant, i.e. $C_3 = 1/9\omega^2 L$. The parallel resonant circuit shunting $C_3$ via $C_1{}^3$ passes no current at 3$\omega$ and can, therefore, be ignored to first approximation in calculating the resonant features of the main third harmonic current pathway. In calculating the fundamental harmonic resonance condition, it is noted that the parallel circuit behaves as an inductor at frequency $\omega$. This effective inductor, given by $$L_{1eff} = (9/8)L \quad (3)$$

is combined with the series capacitance $C_1{}^3$ to produce an effective capacitance given by $$C_1{}^3 \text{eff} = C_1{}^3(1-\omega^2 C_s L_{eff}). \quad (4)$$

This is combined in parallel with $C_3$ to resonate with L at frequency $\omega$. Solution of the resonant circuit equation gives $$C_1{}^3 = 4/(9\omega^2 L) = 4C_3 \quad (5)$$

If resistance is reintroduced into the circuits, the resonance conditions will be changed slightly so that the two resonant frequencies may not be exactly a factor of three different. It will then be necessary to trim capacitor $C_1^3$ in order to get the exact frequency and phase relationship between the two harmonics.

Figure 4:
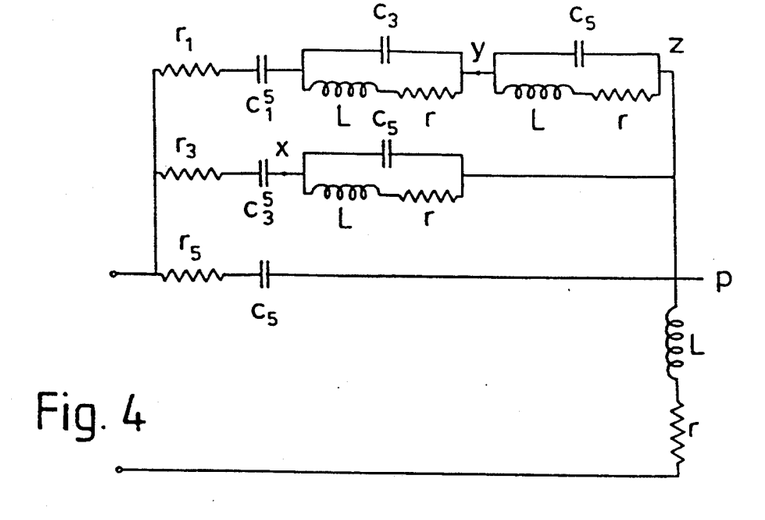
FIG. 4 shows a trimodal series resonant circuit of order l=5.

The principles may be straightforwardly extended to include the first three or more resonant harmonics. FIG. 4 shows the basic principle extended to cover the resonant modes up to and including $5\omega$. The design process is similar to that outlined above, namely that the additional two shunt circuits are arranged to reject current at $5\omega$ in which case $C_5$ and $L$ form a simple series resonant circuit tuned to $5\omega$. Again we have chosen all inductors to be of value $L$ and for the initial design we again assume all resistors are zero. Resistance is reintroduced at the next step when phase and frequency are adjusted by varying $C_1^5$ and $C_3^5$ in an iterative cycle.

When all resistors are zero, we obtain for the circuit of FIG. 4

$$C_3^5 = (8/9)C_5 \tag{6a}$$

and $$C_1^5 = (100/13)C_5. \tag{6b}$$

For a multi-modal resonant circuit like FIGS. 3 and 4 with modes, in which all inductors have the same value $L$, the resonant capacitors for the nth mode, $1 < n \leq l$, are given by $$C_n = 1/n^2\omega^2 L. \tag{7a}$$

The series capacitors $C_n^l$ may be represented by the expression $$C_n^l = l^2 C_l K_n^l. \tag{7b}$$

$Kn_n^l$ is a calculable constant for the lth order filter. For the 3rd order filter of FIG. 3, therefore, $K_1^3 = 4/9$. For the 5th order filter of FIG. 4 $K_1^5 = 4/13$ and $K_3^5 = 8/(9 \times 25)$. For a 7th order filter $K_1^7 = 2.362275 \times 10^{-1}$, $K_3^7 = 2.65736 \times 10^{-2}$ and $K_5^7 = 9.7959 \times 10^{-3}$.

Circuit Redundancy

The 5th order circuit of FIG. 4 comprises two tuned rejection circuits or traps resonant at $5\omega_o$ and one tuned circuit resonant at $3\omega_o$. Higher order filters would include more duplication of the rejection circuits. However we note from FIG. 4 that if the rejection filter between points Y and Z is removed and points X and Y joined, the same purpose is served, namely, that each rejection filter isolates all circuitry above it from currents at or above its resonance frequency. This removes circuit redundancy, thereby making the filter easier and cheaper to construct. Fewer circuit components also reduce the resistance thereby making the overall Q higher. The circuit is therefore transformed from a parallel arrangement to a cascaded parallel arrangement or ladder network.

Figure 5:
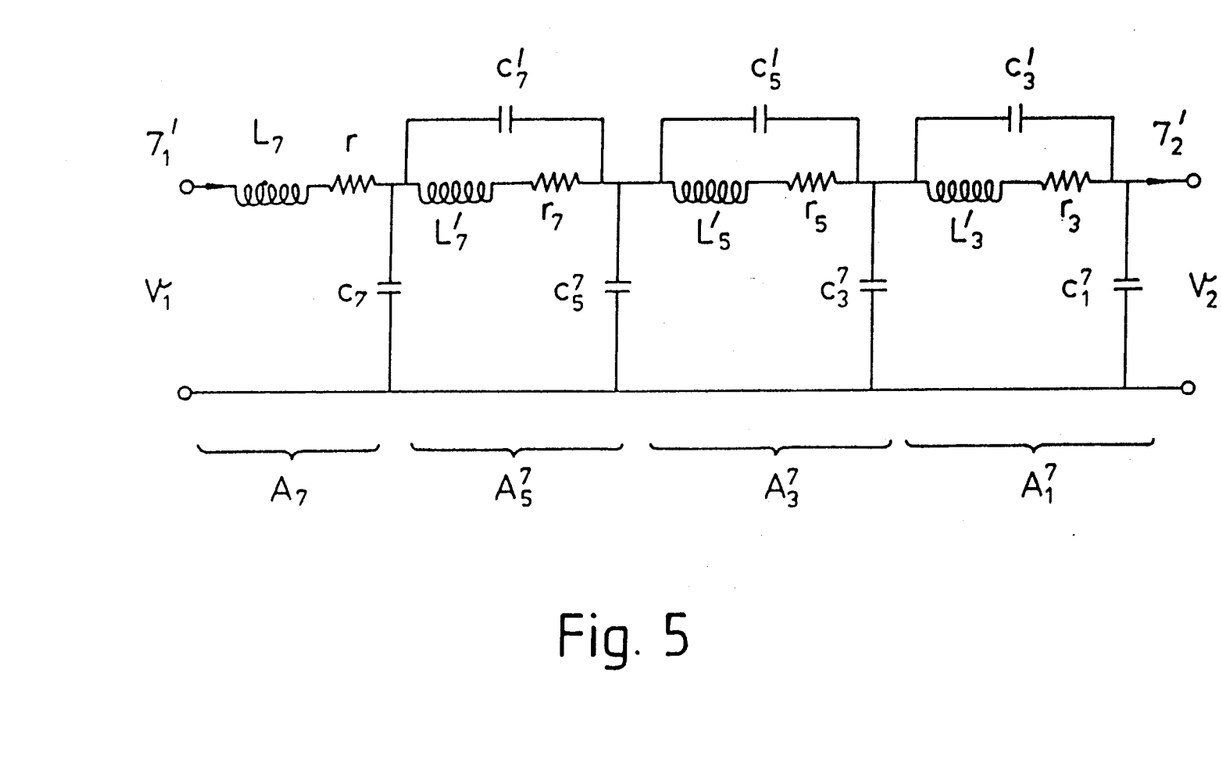
FIG. 5 shows a quadrimodal series resonant circuit of order l=7 in the form of a ladder network. This form of filter uses fewer tuned trap circuits. The transfer matrices $A_n^7$ for each L-section are annotated.

With this modification, the higher order filters simply require additional L-sections. Also the response of such a circuit is straightforward to calculate using the product of individual transfer matrices for each section. FIG. 5 shows a 7th order filter or ladder network. The transfer matrix for this circuit is given by $$M^7 = A_7^7 A_5^7 A_3^7 A_1^7 \tag{8a}$$

where for $L_n' = L_n' = L$ and $C_n' = C_n$ and for $r = r_n = 0$ $$A_n = \begin{pmatrix} 1 - \beta^2/7^2 & j\omega L \\ j\omega C_7 & 1 \end{pmatrix} \tag{8b}$$

and $$A_n^7 = \begin{pmatrix} \dfrac{1 - \beta^2/C_{n-2}^7/7^2 C^7}{1 - \beta^2/n^2} & j\omega L \\ j\omega C_{n-2}^7 & 1 = \beta/n^2 \end{pmatrix} \tag{8c}$$

where $$\beta = \omega/\omega_o \tag{8d}$$

$n = 1, 3$ and $5$.

The input and output voltages and currents are respectively $V_1 I_1$ and $V_2$. When $i_2 = 0$ the input impedance $Z_1$ is given in terms of the transfer matrix elements by $$Z_1 = M_{11}^7 / M_{21}^7. \tag{9}$$

At the nodal resonances $Z_1 = 0$ so that equations 8 and 9 can be used to evaluate the capacitor values. Because of the action of the traps, evaluation of the capacitors can be carried out in tandem starting with the highest made and ignoring all other circuit sections of equal and lower frequency. Adopting this approach we find for the 7th order filter that $K_5^7 = 9.7959 \times 10^{31}$ $^3$; $K_3^7 = 2.27027 \times 10^{-2}$ and $_1^7 = 2.22225 \times 10^{31\ 1}$.

As expected, the first ratio agrees with our previous result but the other values differ by virtue of the removed circuit redundancy.

In an alternative arrangement $L_7$ and $C_7$ are interchanged and also the traps $L_n^7$, $C_n^7$ are interchanged with the ring capacitors $C_{n-2}^7$ of the ladder network.

A further alternative arrangement in which the capacitors $C_n' = 0$ is also possible. In this case $L_n \neq L_n' \neq L$. A still further arrangement with $C_n' = 0$ is possible in which the inductor $L_7$ is interchanged with the ring capacitor $C_7$ and $L_n'$ interchanged with the ring capacitors $C_n^7$. It is to be understood that the resistors $r_n$ are values associated with their respective inductors and include the intrinsic resistance of the inductor.

The approach developed here is readily extended to any order including the selective odd and even frequency modes. This latter feature is useful in cases where frequency modes are not present in a required waveform.

A desirable feature of this discrete filter circuit is that all additional resistors when introduced to the parallel tuned circuits make $r_n$ equal. This means that the Q values of the various harmonics are given by $$Q_n = n\omega L/r \tag{10a}$$

The rise time $t_{Rn}$ of all parallel circuits is given by $$t_{Rn} = T_n Q_n/\pi = (2\pi/n\omega)(n\omega L/r\pi) \tag{10b}$$
$$= 2L/r = t_R,$$

where $T_n$ is the period of oscillation. This ensures that all harmonics strap in phase. If the rise times for all current harmonics in the gradient coil are not constant the initial response of this circuit will to maintain the correct phase relationships between all harmonics during the establishment of the steady state. The correct phase relationships can be established by introducing resistance $r_n$ into the circuit arms as indicated in FIG. 4. However, in this invention when appropriate we have chosen an alternative phase correction approach which is described below.

Once the equilibrium waveform is established, energy is exchanged between L and the capacitors in the discrete filter. The net amplifier power $P = dE/dt = 0$. This means that only the small energy losses arising from the finite $Q_n$ values have to be supplied from the driver amplifier in order to sustain the waveform. In this case the transitions between waveform extrema can in principle be infinitely fast. In practice it means that the bandwidth of the amplifier limits the waveform rise time rather than the coil inductance and power output.

For a non-energy conserving arrangement comprising a loss-less inductor L driven directly by an amplifier the square wave rise time or step response time $\Delta t$ achievable is given by $$\Delta t = LI/E \quad (10c)$$

where I and E are respectively the peak current and voltage outputs of the driver amplifier. For our linear Techron driver amplifier $I = 360$ and $E = 300$. Using a typical gradient coil inductance of 110 $\mu$H gives $\Delta t = 132$ $\mu$s. Experimentally we operate typically with a lower slew rate corresponding to $\Delta t = 160$ $\mu$s in a non-energy conserving mode.

We shall see hereafter that trapezoidal rise times much shorter than 160 $\mu$s can be readily achieved experimentally using the same values of current and voltage mentioned above in an energy conserving mode.

Trapezoidal Waveforms

We have concentrated so far on the generation of approximations to a pure square wave modulation. However, in practice using linear amplifiers one often manages with trapezoidal waveforms. It is therefore interesting to note that trapezoidal waveforms may themselves be simulated by Fourier series and can often be more convergent than the generation of direct square wave functions. The difference between the peak currents required in a trapezoidal waveform versus a square wave is proportional to the ratio of the areas contained within or under the waveform in a half period. In the case of the rather severe trapezoidal waveform given in FIG. 6 the Fourier series is given by $$f(t) = (6\sqrt{3}/\pi^2) \{\sin \omega t - (1/5^2)\sin 5\omega t + (1/7^2)\sin 7\omega t - (1/11^2)\sin 11\omega t \ldots \}. \quad (11)$$

Figure 6:
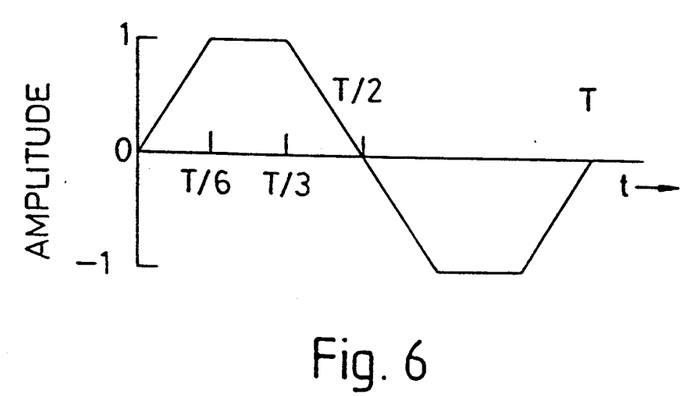
FIG. 6 shows a trapezoidal waveform in which the rise time to full unit amplitude takes 1/6th of the period T.
Figure 7:
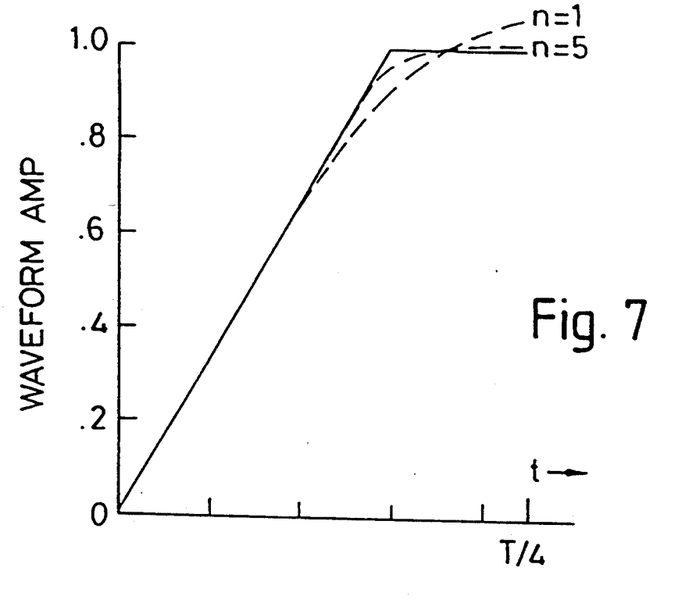
FIG. 7 shows a trapezoidal waveform as in FIG. 6 plotted over a quarter period together with a first and fifth harmonic fit, (Eq. 11)

The amplitudes of the third, ninth and fifteenth harmonics are missing and it is also noted that the amplitude of the harmonics varies as $1/n^2$ making the series more rapidly convergent. FIG. 6 shows the first two harmonics of Equation (11) and the fit to the trapezoidal waveform of FIG. 5. The Fourier harmonic amplitudes are given by $$A_n = (4/T) \int_0^{T/2} f(t)\sin n\omega t \, dt \quad (12)$$

where T is the waveform period.

Figure 8:
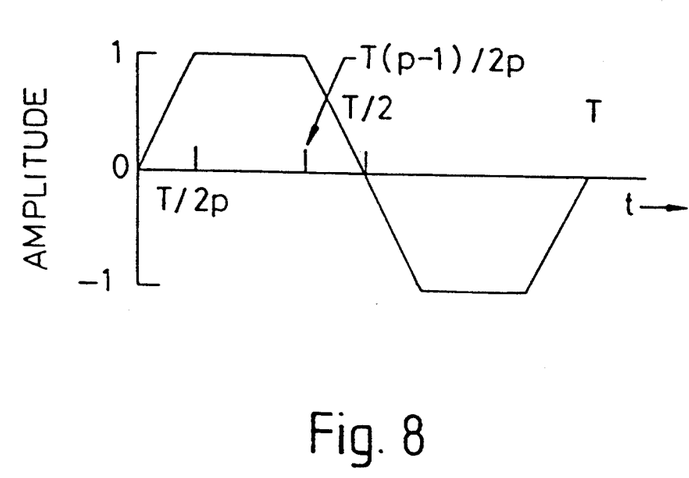
FIG. 8 shows a general trapezoidal waveform in which the rise time to the full unit amplitude is T/2p where T is the period of the waveform and p is an integer.

It is instructive to evaluate $A_n$ for the general trapezoidal waveform shown in FIG. 8 in which the linear ramp rises to 1.0 in time T/2p where p is an integer. We define the function f(t) over the half period as $$f(t) = t(2p/T) \quad \text{for } 0 < t < T/2p$$
$$f(t) = 1 \quad \text{for } T/2p < t < T(p-1)/2p$$
$$f(t) = p - t(2p/T) \quad \text{for } T(p-1)/2p < t < T/2.$$

These functions may be used to evaluate $A_n$, Eq. 12. This gives $$A_n = (4p/\pi^2 n^2) \{\sin(n\pi/2) \cos[n\pi(p-2)/2p]\} \quad (13)$$
$$= (4/\pi^2) B_n(p).$$

Equation 13 shows that convergence to a given waveform approximation can be achieved by choosing p to remove particular harmonics in the series. For example when p is odd, odd harmonics starting with $n = p$ are removed. When p is even, all lower odd harmonics remain.

Figure 9:
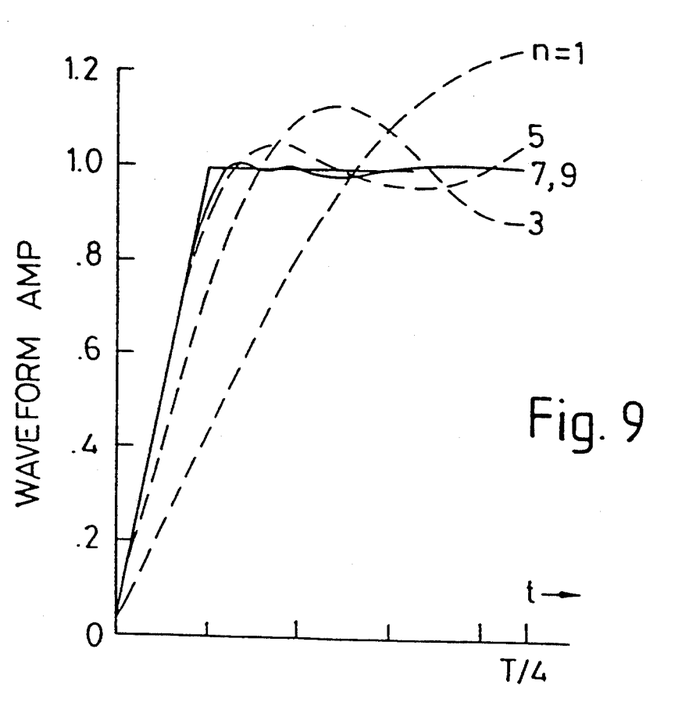
FIG. 9 shows a plot over a quarter period of a trapezoidal waveform of the type in FIG. 7 with p=9. Also plotted is the waveform synthesis up to and including the order n. (Note that the amplitudes of all even orders vanish, Eq. 13)

The synthesis to various orders in n over a quarter cycle is shown in FIG. 9 for a trapezoidal waveform with $p = 9$. Since the 9th order vanishes the solid curve $n = 7$ is accurate up to 11th order.

Figure 10A:
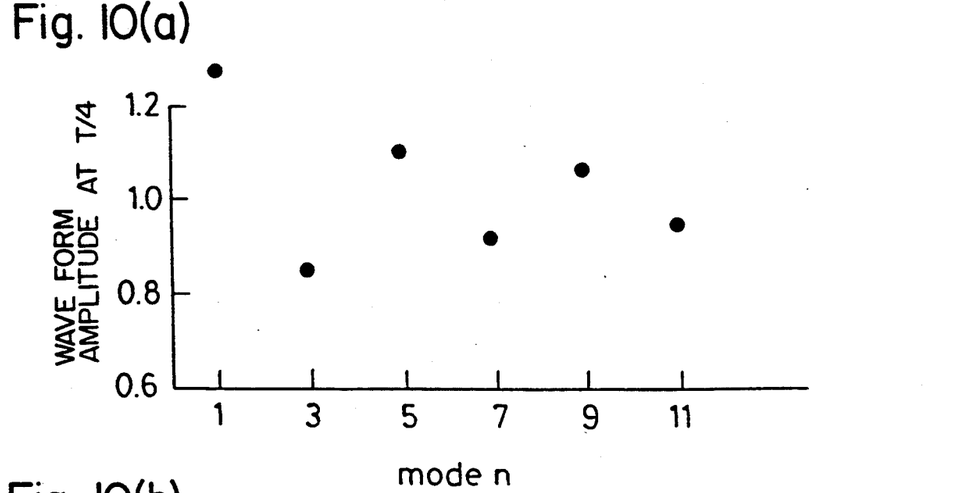
Figure 10B:
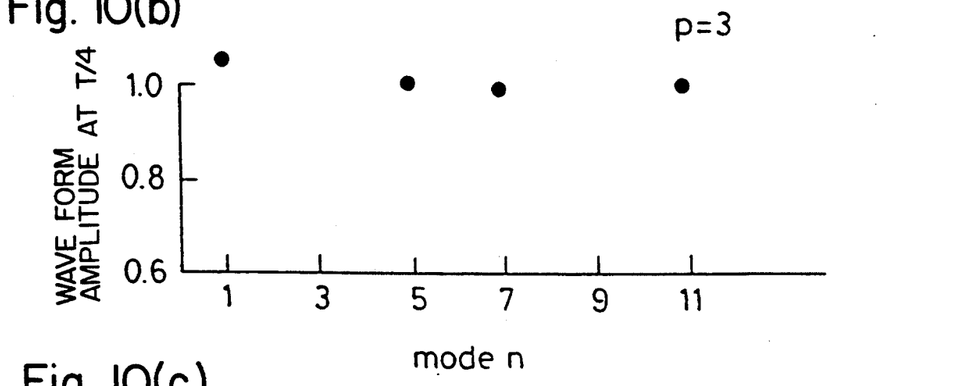
Figure 10C:
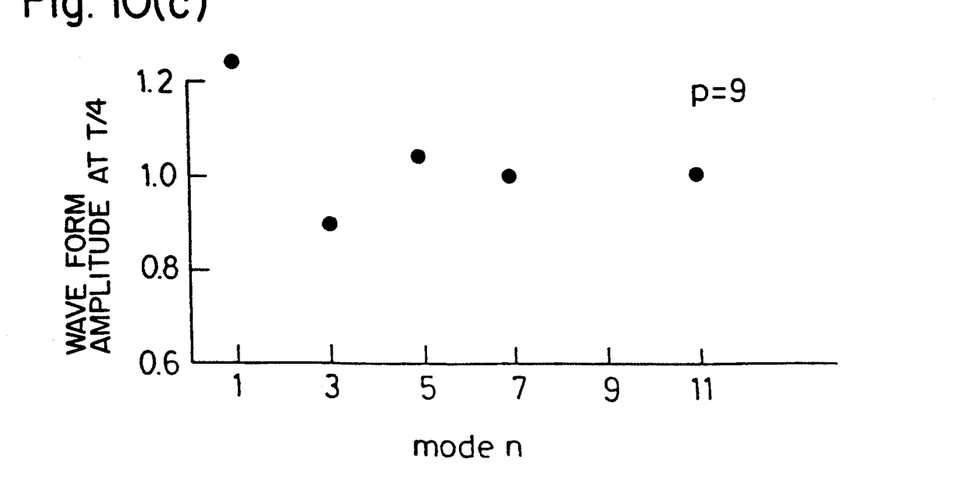

Using Eqs. 1 and 13 we plot in FIG. 10 the waveform amplitude at time T/4 synthesised up to and including $n = 11$ for the square wave and various trapezoidal waveforms. By choosing the trapezoidal ramp time as described above it will be seen that the number of resonant modes in the discrete filter circuit may be reduced.

Figure 11A:
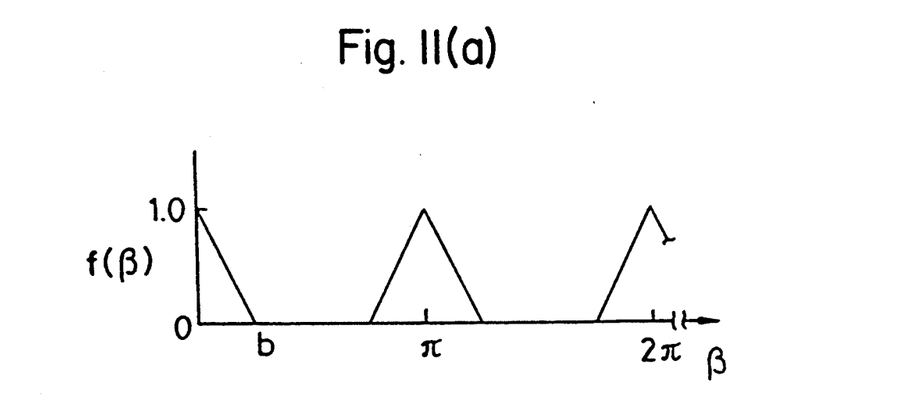
FIG. 11(a) shows a sketch of general trapezoidal waveform f($\beta$) with 2b windows.

The more general trapezoidal waveform of FIG. 11a may also be produced with relatively few odd harmonics. This function is represented by the expression $$f(\beta) = 4_n \Sigma \{(\sin nB - \sin nb)\sin n\beta\}/\pi(B-b)n^2. \quad (14)$$

with $n = 1, 3, 5 \ldots$ and where $\beta = (2nT)t$ and T is the period. The delay 2b represents a useful window for the application of other gradients and/or RF pulses in EPI and EVI experiments.

Circuit Drive

The discrete frequency filter approach developed above assumes that the output phase relationship of all harmonics is equal to that of the driving waveform. In an ideal circuit that would be the case. In practice there may be slight differences in phase between the harmonic components introduced by inequalities in inductance and resistance among the components and also through the effects of stray capacitance within the inductors which has been entirely ignored in this analysis. Of course, stray interturn capacitance within the inductances will only become important at very high frequencies, i.e. very high harmonics, and so may not constitute a problem. Nevertheless, the other factors mentioned can introduce undesirable phase shifts which could be tedious to eliminate. An alternative approach therefore is to tailor the input drive waveform by synthesising the desired Fourier components, but at the same time adding in a phase term to each Fourier component which may be varied in order to generate the correct output phase relationship in the circuit. In this case the driving waveform for the square wave modulation of Eq. 1 would become $$f(t) = (i.p)_n \Sigma A_n e^{i(n\omega t + \theta_n)} \tag{15}$$

with $n = 1, 3, 5 \ldots$, where $\theta_n$ is the introduced phase shift for the nth mode and the coefficient $A_n$ is given by equation (13).

The present invention discloses a systematic way of designing a discrete filter circuit which has a multi-mode series response useful for driving a series resonant gradient coil for use in ultra high speed NMR imaging. Detailed circuits are described which respond to a truncated Fourier series comprising two and three harmonics respectively. However, the principles described may be readily extended to higher harmonics and to the generation of waveforms other than square wave, where the Fourier series is more convergent and where the amplitude of particular harmonics may be designed to be zero, thus reducing the circuit complexity necessary to generate the waveform.

The circuits described above are entirely passive arrangements and therefore have a considerable advantage over switched non-linear circuits where expensive components are required. In some instances it is possible to generate usable waveforms for techniques like echo-planar imaging or echo-volumar imaging straight away using existing power amplifiers. This will be especially useful in situations where non-linear switching circuits capable of producing trapezoidal gradient waveforms of the desired strength are impractical with current technology.

We have concentrated on odd harmonic waveforms but more general current waveforms may be generated by including even harmonics in the filter. A DC current in the gradient coil may also be introduced by directly connecting an additional amplifier or power supply across the gradient coil at point P indicated in FIG. 4. This would constitute an independent current source.

Figure 11B:
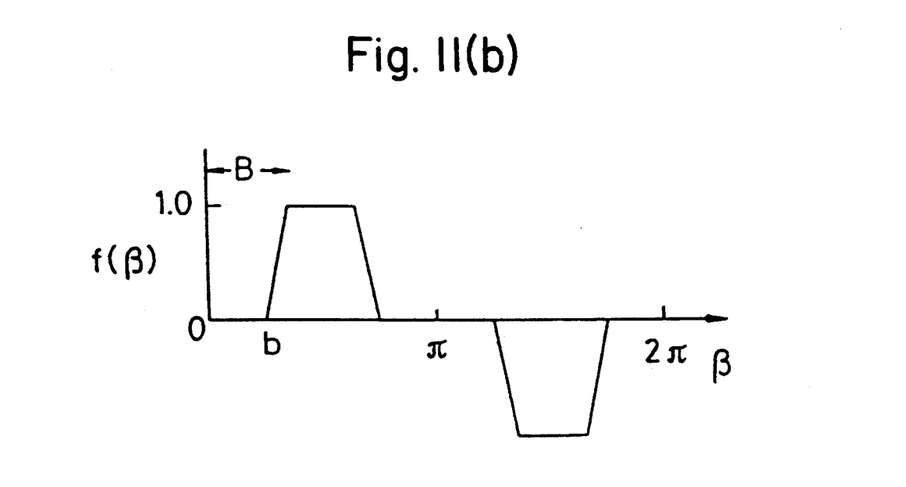
FIG. 11(b) shows a sequence of triangular blips f($\beta$) useful for echo-planar or echo-volumar imaging.

To achieve sufficient isolation from a separate amplifier a simple resistor may be used to connect point P to the extra amplifier. This arrangement is fine when the DC current level (not shown) is relatively low. The resistors can then be high so as not to load the filter driver nor to introduce large current phase differences in the gradient coil. With DC and a sufficient number of harmonic modes, the circuit is capable of generating other waveforms including a series of positive or negative short duration current blips, also useful in echo-planar and echo-volumar imaging methods. A sequence of triangular blips is sketched in FIG. 11b and is represented by the convergent series $$f(\beta) = b/2\pi + 2_n \Sigma \{(1 - \cos nb) \cos n\beta\}/\pi b n^2. \tag{16}$$

where $n = 1, 2, 3 \ldots$ and in which $\beta = (2n/T)t$.

Experimental Results

Figure 12A:
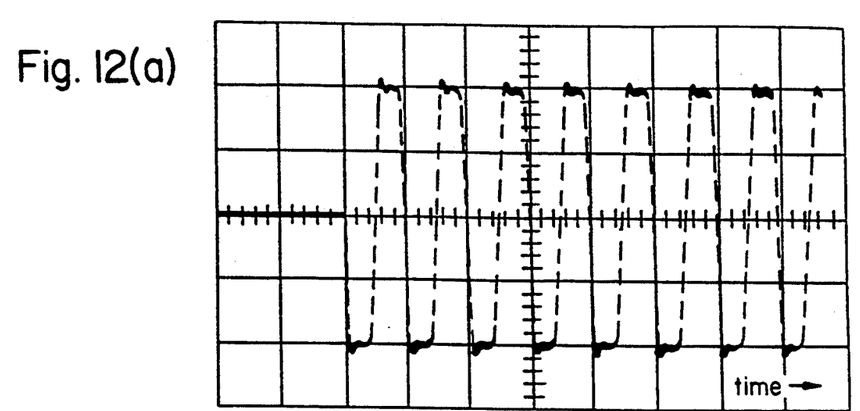
FIGS. 12(a)-12(c) show experimental results showing phase compensated trapezoidal wave approximations using three harmonic components. 12(a) Synthesised driver input. 12(b) Current output through the inductance with the Techron amplifier in constant voltage mode. 12(c) Current output through the inductance with the Techron amplifier in constant current mode. Time base in all cases 1 ms per large division. Peak current 10 A.
Figure 12B:
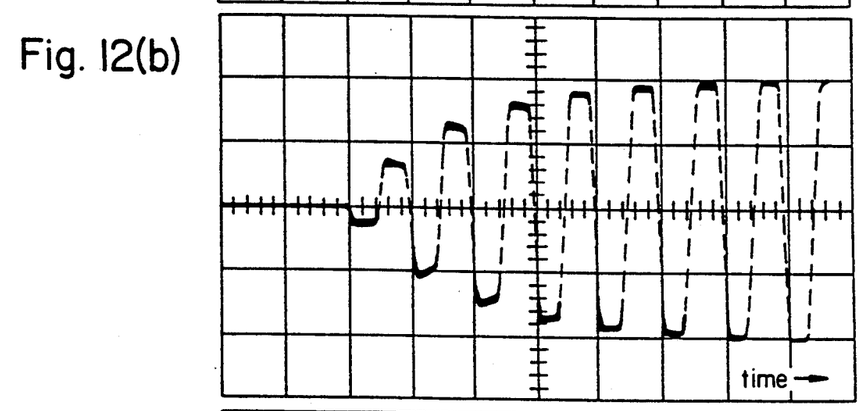
Figure 12C:
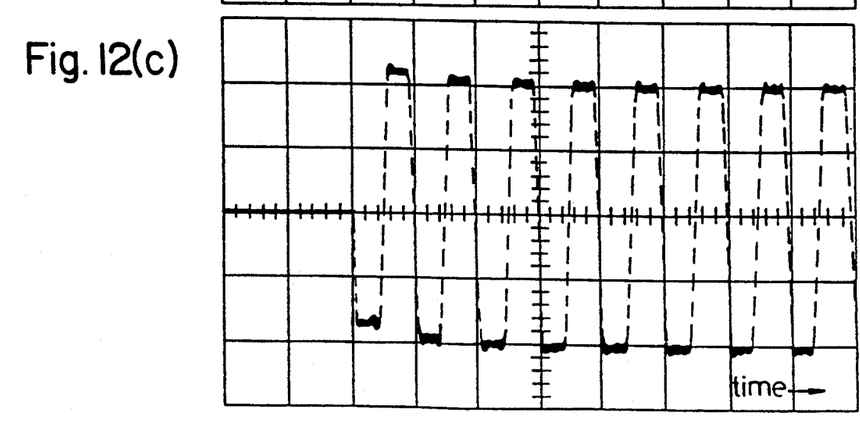

Using the principles described above, we have constructed a 5th order discrete filter network as indicated in FIG. 4 in which the gradient coil inductance $L = 130$ $\mu H$. The fundamental frequency is 1.0 kHz with harmonics at 3.0 kHz and 5.0 kHz. The driver used in these experiments is a Techron amplifier. In the present experiments total peak currents of up to 10 A have been passed through the inductance (Much larger currents have recently been achieved). The Techron amplifier was driven from a waveform controller in which the drive waveform was synthesised from three frequency components according to equation (1). FIG. 12a shows the synethesised driver waveform. When the Techron amplifiers are run in constant voltage mode, the current waveform through L is as indicated in FIG. 11b. The overall rise time $t_R$ for this waveform is determined by equation (10b) and indicates that the individual rise times $t_{Rn}$ for each harmonic component are in this case equal, thus preserving the trapezoidal waveform shape during establishment of equilibrium. When the Techron amplifier is operated in a constant current mode, the output current through L is as indicated in FIG 11c. Here the initial response is much speeded up, establishing the equilibrium conditions in approximately a half cycle. In all cases the driver waveform corresponds to a phase compensated square wave approximation.

Figure 13A:
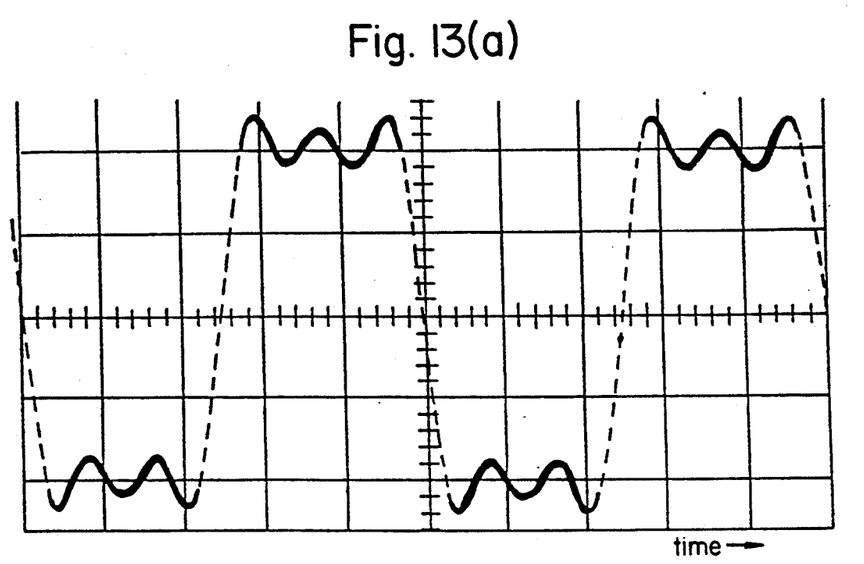
FIGS. 13(a) and 13(b) show experimental results showing synthesised square wave approximations using three Fourier harmonics. 13(a) Driver amplifier input. 13(b) Current output through inductance with amplifier in constant current mode. Time base is 200 $\mu$s per large division. Peak current 10 A.
Figure 13B:
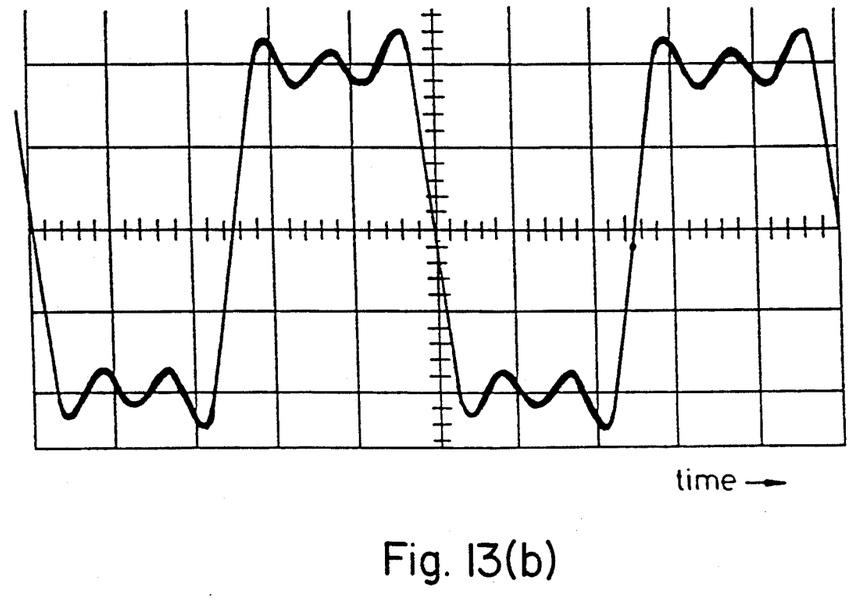

FIG. 13 shows the waveforms for a non-phase compensated square wave. FIG. 13a is the drive input and FIG. 13b the current output through L. On this expanded time base of 200 $\mu s$ per large division, the rise time is $\sim 80$ $\mu s$. These waveforms clearly indicate that three Fourier harmonics are not sufficient to give a good square wave approximation.

Figure 14A:
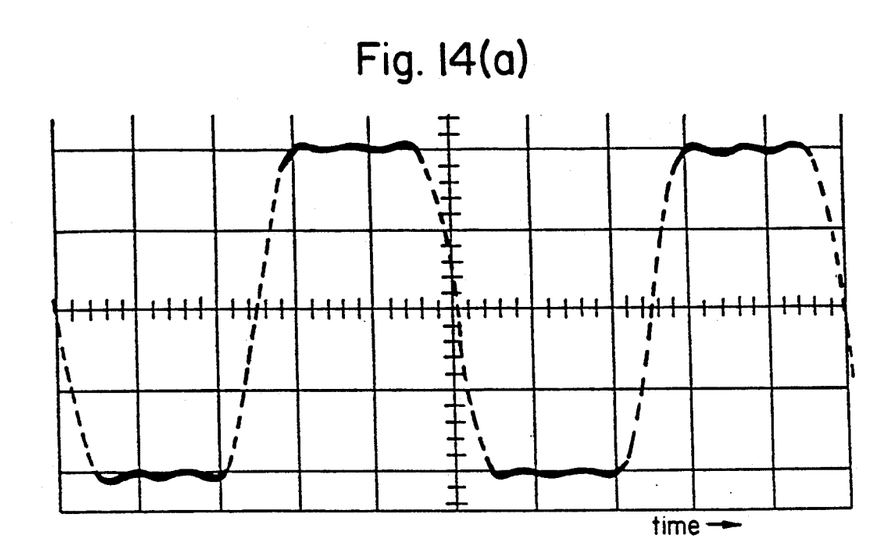
FIGS. 14(a) and 14(b) show experimental results showing synthesised trapezoidal waveforms using three Fourier harmonics with p=7, equations (13) and (15). 14(a) Driver amplifier input. 14(b) Inductor current output. The rise time of the trapezoidal edge is ~80 $\mu$s. Time base is 200 $\mu$s per large division. Peak current 10 A.
Figure 14B:
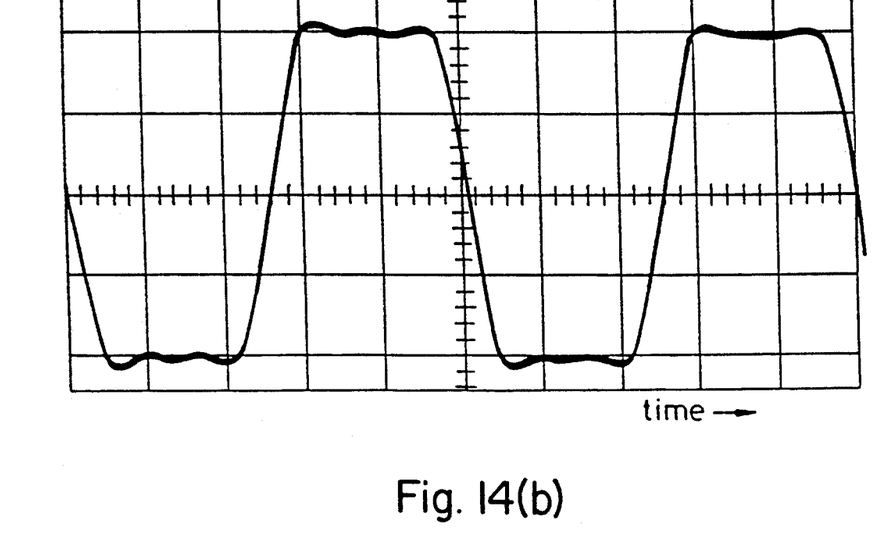

FIG. 14 shows experimental trapezoidal waveforms corresponding to $p = 7$ in equations (13) and (15). This value of p gives a rise time of 71.4 $\mu s$ and is in good agreement with the experimentally observed value. The small ripple observed on the waveform plateaux can be further reduced by the addition of extra harmonics in the filter circuit.

Waveforms similar to those of FIG. 14 can now be routinely produced with peak currents of up to 360 A. Using the principles of active gradient coil screening (Mansfield, P. and Chapman, B., 1986, J. Mag. Res., 66, 573–576) our gradient set can be switched within the close confines of a superconductive magnet. The much reduced levels of induced eddy currents in the surrounding metallic structures produce negligible phase effects in our images.

In an alternative multi-mode circuit arrangement, all parallel resonant circuits in FIGS. 3 and 4 are replaced by inductors, thus turning the cascaded circuits AA', BB' etc. of FIG. 4, for example, into a cascaded or parallel arrangement of series resonant band pass circuits. With this alternative discrete filter arrangement, however, unwanted frequency modes may occur in addition to the desired operating modes. This may not be a problem when the circuit is energised from a well chosen set of discrete frequency harmonics.

In a further embodiment capacitors $C_n'$ in FIG. 5 may be removed so that the circuit reduces to a cascaded parallel set of inductors $L_n$, in series with capacitors $C_n^m$ where m is the order of the filter.

In order to minimise resistive losses in either of the discrete filter embodiments, the inductive components may be cooled in a refrigerant to reduce resistance.

We have concentrated on the generation of simple waveforms derived analytically from truncated Fourier series. However, an alternative approach is to start with the desired practical current waveform and then Fourier transform this to yield the harmonic spectrum. The harmonic spectrum amplitudes are then used directly to synthesise the waveform. In this approach the effect of a finite waveform train can be taken into account by adjusting the filter Q value.

We have described a systematic way of designing a discrete filter circuit which has a multi-mode series response useful for driving a series resonant gradient coil for use in ultra high speed NMR imaging. Detailed circuits are described which respond to a truncated Fourier series comprising two and three harmonics respectively. However, the principles described may be readily extended to higher harmonics and to the generation of waveforms other than square wave, where the Fourier series is more convergent and where the amplitude of particular harmonics may be designed to be zero, thus reducing the circuit complexity necessary to generate the waveform. In all cases our approach exploits the energy conserving principle so that current waveform rise times for a given gradient coil and driver amplifier can be considerably faster than can be achieved by direct non-resonant drive through the coil.

The circuits described above are entirely passive arrangements and therefore have a considerable advantage over switched non-linear circuits where expensive components are required. In some instances it will be possible to generate usable waveforms for techniques like echo-planar imaging or echo-volumar imaging straight away using existing linear power amplifiers. This will be especially useful in situations where non-linear switching circuits capable of producing trapezoidal gradient waveforms of the desired strength are impractical with current technology.

Although emphasis has been given to the generation of multi-modal harmonic gradients at relatively low frequencies, the circuits developed are general and could operate at higher frequencies including RF. Adaptation to RF coil design is preferably valuable for bi-modal, tri-modal and in general multi-modal RF circuits for the transmission and/or reception of RF signals arising in multi-nucleii NMR including NMR imaging and NMR spectroscopy.

We claim:

1. A multi-mode resonant coil circuit comprising:
   a magnetic gradient field coil designed to produce a desired magnetic field which changes in strength in a certain given direction,
   passive components which are effective to generate a square or trapezoidal output current waveform in said magnetic gradient field oil when supplied with an input current waveform comprising a series of weighted Fourier Harmonics, and
   connections between said passive components and said coil arranged so that a total current input to the components passes through the magnetic gradient field coil.

2. A multi-mode resonant coil circuit as claimed in claim 1 further comprising a voltage generator or current generator for supplying said input current waveform.

3. A multi-mode resonant coil circuit as claimed in claim 1 in which the passive components comprise a first arrangement including a plurality of capacitors, resistors and further coils,
   a second coil, in series with the first arrangement,
   the first arrangement including said plurality of capacitors, resistors and further coils connected in at least two parallel circuits, each parallel circuit comprising at least one capacitor and at least one of said further coils, in series.

4. A method of generating a square wave or trapezoidal waveform for an NMR apparatus comprising the steps of:
   connecting a passive electrical circuit in series with one terminal of a gradient coil,
   connecting a source, which can be a current or voltage waveform source, across the coil and the passive electrical circuit, and
   energizing said source,
   in which said connecting step includes connecting the gradient coil in a way in which all of the current from said source passes through said gradient coil and in which the current or voltage waveform comprises a series of suitably weighted Fourier Harmonics.

5. A multi-mode resonant coil circuit as claimed in claim 1 wherein said passive components are arranged in the form of a ladder network or cascaded parallel circuit comprising a plurality of parallel resonant traps in series with periodically placed shunt capacitors forming rungs of the ladder network.

6. A multi-mode resonant coil circuit as claimed in claim 1 wherein said passive components are arranged in the form of a ladder network or cascaded parallel circuit comprising a plurality of series capacitors with periodically placed parallel resonant traps forming rungs of the ladder network.

7. A multi-mode resonant coil circuit as claimed in claim 1 wherein said passive components are arranged in the form of a ladder network or cascaded parallel circuit comprising a plurality of series coils with periodically placed shunt capacitors forming rungs of the ladder network.

8. A multi-mode resonant coil circuit as claimed in claim 1 wherein said passive components are arranged in the form of a ladder network or cascaded parallel circuit comprising a plurality of series capacitors with periodically placed shunt coils forming rungs of the ladder network.

9. A multi-mode resonant current as claimed in claim 1 in which the circuit is driven by at least one constant current amplifier.

10. A multi-mode resonant circuit according to claim 1 in which the circuit is driven by at least one constant voltage amplifier.

11. A coil as claimed in claim 8 in which the coil is driven by two amplifiers.

12. A coil as claimed in claim 9 in which the coil is driven by two amplifiers.

13. A coil as claimed in claim 11 in which one of the amplifiers is a d.c. amplifier.

* * * * *